United States Patent [19]

Tajadod et al.

[11] Patent Number: 5,716,859
[45] Date of Patent: Feb. 10, 1998

[54] METHOD OF FABRICATING A SILICON BJT

[75] Inventors: James Tajadod, Dedham; Timothy Edward Boles, Tyngsboro; Paulette Rita Noonan, Dracut, all of Mass.

[73] Assignee: The Whitaker Corporation, Wilmington, Del.

[21] Appl. No.: 741,444

[22] Filed: Oct. 31, 1996

Related U.S. Application Data

[60] Provisional application No. 60/009,135, Dec. 22, 1995.

[51] Int. Cl.$^6$ .................................................. H01L 21/265
[52] U.S. Cl. ........................... 437/32; 437/31; 437/917; 148/DIG. 96
[58] Field of Search ....................... 437/31, 32, 34, 437/59, 917; 148/DIG. 10, DIG. 11, DIG. 96

[56] References Cited

U.S. PATENT DOCUMENTS

| | | | |
|---|---|---|---|
| 4,210,689 | 7/1980 | Komatsu | 437/148 |
| 4,315,271 | 2/1982 | Roger | 357/20 |
| 4,381,953 | 5/1983 | Ho et al. | 148/1.5 |
| 4,573,256 | 3/1986 | Lechaton et al. | 29/576 B |
| 4,617,724 | 10/1986 | Yokoyama et al. | 29/576 B |
| 4,679,305 | 7/1987 | Morizuka | 29/576.3 |
| 4,750,025 | 6/1988 | Chen et al. | 357/34 |
| 4,758,870 | 7/1988 | Hase et al. | 357/34 |
| 4,803,181 | 2/1989 | Buchmann et al. | 437/228 |
| 4,825,265 | 4/1989 | Lunardi et al. | 357/16 |
| 4,923,563 | 5/1990 | Lee | 156/649 |
| 4,957,874 | 9/1990 | Soejima | 437/31 |
| 4,963,501 | 10/1990 | Ryan et al. | 437/40 |
| 4,967,254 | 10/1990 | Shimura | 357/34 |
| 5,017,995 | 5/1991 | Soejima | 357/43 |
| 5,023,203 | 6/1991 | Choi | 437/228 |
| 5,063,167 | 11/1991 | Shimura | 437/31 |
| 5,066,615 | 11/1991 | Brady et al. | 437/229 |
| 5,073,512 | 12/1991 | Yoshino | 437/150 |
| 5,130,272 | 7/1992 | Ferla et al. | 437/150 |
| 5,296,410 | 3/1994 | Yang | 437/228 |
| 5,397,731 | 3/1995 | Takemura | 437/67 |
| 5,516,710 | 5/1996 | Boyd et al. | 437/31 |

FOREIGN PATENT DOCUMENTS

| | | |
|---|---|---|
| 0300803 A2 | 1/1989 | European Pat. Off. |
| 052737A1 | 7/1992 | European Pat. Off. |
| 2 508 704 | 6/1981 | France |
| 0102744 | 5/1986 | Japan |
| 0137364 | 6/1986 | Japan |
| 0053971 | 3/1988 | Japan |
| 63-177464 | 7/1988 | Japan |

OTHER PUBLICATIONS

IBM Technical Disclosure Bulletin; Title: High–Performance Intrinsic Bipolar Translator; Date: Jul. 1993, pp. 479–482.

T.Aoyama, et al.; Title: Selective Polysilicon Deposition (SPD) by Hot–Wall LPCVD and Its Application to High Speed Bipolar Devices; Date: Unknown; pp. 665–668.

Self–Aligned ALGaAs/GaAs HBTs and 35 PS 1cml Ring Oscillators Fabricated by Mg and P Double Implantation; K. Morizuk, et al.; Extended Abstracts of the 18th (1986 International) Conference on Solid State Devices and Materials, Toykyo, 1986, pp. 359–362.

*Primary Examiner*—Tuan H. Nguyen
*Attorney, Agent, or Firm*—William S. Fraucos

[57] ABSTRACT

A method of fabricating a bipolar junction transistor having emitter line spacings on the order of approximately 0.25 microns or less is disclosed. Windows are opened in the silicon dioxide layer for the emitter collector and base fabrication. A layer of silicon nitride is disposed on top of the layer of silicon dioxide having been deposited over he entire surface containing approximately 0.5 width line features at he emitter, base and collector sites. Silicon nitride is deposited by low pressure chemical vapor deposition (LPCVD). The deposited nitride film is etched using a standard reactive ion etching technique, removing the silicon nitride from the horizontal surfaces of the oxide without removing the nitride from the sidewalls of the etched opening at the emitter, base and collector sites. The result of the RIE etching is that the thickness of the film on the horizontal surfaces is removed without removal of the nitride from the sidewalls of the etched pattern. The resulting spacer produces the window of the original features at the emitter, base and collector by a dimension of approximately 2X the thickness of the deposited silicon nitride.

12 Claims, 2 Drawing Sheets

METHOD OF FABRICATING A SILICON BJT

This is a provisional application of Ser. No. 009,135, filed Dec. 22, 1995.

FIELD OF THE INVENTION

The invention of the present disclosure is an improved technique for fabricating a BJT having improved performance characteristics.

BACKGROUND OF THE INVENTION

In the realm of microwave transistors, both bipolar and field effect transistors, higher frequency performance has required narrower and narrower line width. Bipolar IC technology has traditionally been the choice technology for high speed application. This is partly due to the fact that in this technology transit time is determined by the base width of the bipolar device; the base width not being determined by lithography as is the case with the channel length of MOS devices, but rather by the difference between the impurity diffusion profiles of the emitter and base. In the silicon BJT device structure, a reduction in line width corresponds to smaller emitter areas as well as a corresponding reduction in the overall base area. With the overall objective of reduction of capacitances between the junctions, in particular the emitter base junction, the result is shorter emitter base charging times, as well as a reduced transit time across the base. This translates into an increase in overall device switching speeds and frequency characteristics.

The single material BJT, traditionally silicon, has been the choice technology for high speed application. This is due in part to the fact that this technology enables transit times that are determined by the base width of the bipolar device.

In order to improve high frequency performance one approach would be to reduce the emitter width, as well as the base width, to reduce the emitter base capacitance and transit time of carriers, respectively. By reducing the line width, the emitter is fabricated to have a reduced area, and as well, the base can be fabricated at a much closer distance from the emitter. Accordingly, the dopant profile of the emitter is reduced in area, reducing the parasitic capacitance at the base/emitter junction, and as well the extrinsic base region is also reduced. This reduction in the extrinsic base region corresponds to a reduced transit time. Lower capacitance translates into shorter emitter base charging times, thus increasing the overall device frequency characteristics. In bipolar silicon devices, the two micron barrier for emitter width in the usable device results in devices having usable device performances above one GHz and a device $f_t$ in the range of 3.0 to 4.0 GHz.

As the emitter line widths approach 1.0 microns, transistor frequency response improves to 7 GHz and the usable circuit performance level as high as 3 to 4 GHz. Reduction below line widths of 0.5 microns as proven to be very difficult. To this end, lithography at sub-half-micron levels are beyond the resolution of commercially available contact photolithographic systems. To compound the problem further, standard contact photolithography is limited by the dimensional capability of the photomask suppliers. At present, there are no mask vendors that are capable of supplying masks having line widths on the order of 0.25 microns; the resolution limit for the industry being in the range of 0.4 microns to 0.5 microns. Furthermore, the contact alignment equipment generally has a manufacture specified resolution limit of 1.0 microns.

One example of a reduced or narrower line width is found in U.S. Pat. No. 4,967,254 and its divisional counterpart U.S. Pat. No. 5,063,167 to Shimura. In Shimura, a gallium arsenide based heterojunction bipolar transistor HBT is disclosed having reduced emitter line width. To this end, a subcollector of gallium arsenide has disposed thereon a collector layer ($n^+$doped) a base layer (p doped) an n-type gallium arsenide emitter layer, and an undoped layer disposed thereon. An emitter contact implant of ionic silicon effects a connection to the emitter contact. While the reference to Shimura does disclose the use of a silicon nitride spacer, there are certain drawbacks to the structure disclosed in the reference to Shimura. To this end, the heterostructure bipolar transistor of the Shimura reference is vertical HBT. The emitter layer of the Shimura reference has a width greater than the width of the opening of the $Si_3N_4$ spacer opening. Accordingly, the emitter layer does not have a reduced area and the emitter/base capacitance is not reduced beyond that which is available by conventional lithography and implantation fabrication steps. Accordingly, the width of the emitter layer is not reduced to a satisfactory level for use in high speed BJTs. While reference to Shimura discloses the use of a silicon nitride spacer for use as a mask for a silicon implant through a standard ion implantation technique, this implant merely effects a low resistance region between the emitter layer and the ohmic contact. Another embodiment of the basic structure shown in the reference to Shimura is one in which the emitter layer comprises an undoped layer of gallium arsenide and an implantation of silicon ions is conducted so as to extend into the base layer, below the emitter layer converting the conductivity type of the emitter layer through the ion implantation step. This ion implantation step of the emitter layer at a relatively great depth is not desired in high speed applications. To this end, a steep gradient in the diffusion profile for the emitter, as well as the other regions of the device, is desired for high frequency applications. This is because a steeper gradient in the profiles will result in better transit times across the regions. The gradient of the diffusion profile in the reference to Shimura at the emitter layer is much less steep than desired. Accordingly, as a result of the depth of the implant, diffusion doping results in the width of the emitter layer being greater than the opening of the spacer again resulting in an unacceptable emitter area and emitter/collector capacitance.

Finally, the reference to Shimura shows a tapered spacer, an undesired shape for a mask for an implant step. To this end, the Shimura reference has a rounded or tapered surface in the silicon nitride spacer 11, shown clearly in FIG. 2c of the Shimura reference. During implantation, the distance between the top surface of the mask and the underlying masked region of semiconductor is of a desired thickness. Allowing the silicon nitride to have rounded edges or a tapered profile results in an ineffective mask by a reduction in the distance between the top surface of the rounded spacer and the top surface of the masked region of semiconductor material. That is, the ions impingent on the rounded or tapered portions of the mask (the regions where the mask is not thick) are likely to traverse the mask and come to rest in the semiconductor layer underneath the nitride mask. The result is a less defined diffusion profile, and an increased emitter area with diffusion occurring outside the width of the opening of the silicon nitride spacers. This increase in emitter area increases the parasitic base/emitter capacitance, and is thus not desirable for the reasons stated above.

Accordingly, what is needed is technique for fabricating a lateral BJT having a reduced emitter linewidth and spacing. To this end, what is needed is a technique for forming a doping profile for the emitter having a steep diffusion gradient at a relatively shallow depth. The advantages of such a structure will be a reduction in the emitter/base capacitance, as well as a reduction in the width of the extrinsic base region with the benefit of higher frequency characteristics through a reduction in parasitic capacitance as well as carrier transit times.

SUMMARY OF THE INVENTION

The present invention is drawn to a method of fabricating a bipolar junction transistor having emitter line spacings on the order of approximately 0.25 microns or less. The present invention envisions the fabrication of a npn transistor in the preferred embodiment, although a pnp transistor could be formed by variations of the present disclosure readily apparent to one of ordinary skill in the art. A substrate of p-type material, preferably silicon is used in the fabrication of an isolated structure. An $n^+$ type layer is grown epitaxially on the p-type layer, and an n-type layer of material, again preferably silicon, is grown by standard technique thereon. A layer of silicon dioxide is grown on top of the n-type layer, and selectively etched after photolithography, masking an etching technique in order to selectively open windows in the mask for implanting p-type regions to form the isolation barriers for the device for lateral isolation. Windows are also opened in the silicon dioxide layer for the emitter collector and base fabrication. A layer of silicon nitride is disposed on top of the layer of silicon dioxide, having been deposited over the entire surface containing the 0.5 micron width line features at the emitter, base and collector sites. Silicon nitride is deposited by low pressure chemical vapor deposition (LPCVD) enabling the formation of a silicon nitride layer uniformly posed vertically from the horizontal surface of the silicon dioxide layer, as well as horizontally from the feature sidewalls at the emitter, base and collector sites. The deposited film of silicon nitride is an etched using a standard reactive ion etching (RIE) technique, removing silicon nitride from the horizontal surfaces of the oxide without removing the silicon nitride from the sidewalls of the etched openings at the emitter, base and collector sites. By this reactive ion etching, the thickness of the film on the horizontal surfaces is removed without removal of the nitride from the sidewalls of the etched patterns. A spacer results in the original feature openings as the etched patterns, the spacer being attached to the sidewall of the original feature. The window of the original features at the emitter, base and collector are reduced by a dimension of approximately two times the thickness of the deposited silicon nitride. The resultant spacer has a thickness that is uniform across its width. This thickness across the width of the spacer ensures a good mask for subsequent implantation techniques. Standard ion implantation is used to effect the emitter, base and collector. The emitter implant is done utilizing the nitride spacers in order to reduce the width of the implant to approximately the width of the opening. The present technique enables the fabrication of a silicon bipolar junction transistor having a reduced linewidth and thereby a smaller emitter area, as well the spacing between the emitter and base can be reduced. The reduction in emitter area maps directly into a lower capacitance at the emitter-base junction, while the reduction in base area results in a shorter transit time for carriers across the base region. The final result is an overall increase in frequency characteristics of the device, enabling fundamental oscillations on the order of 12.9 GHz.

Objects, Features, and Advantages

It is an object of the present invention to have a method of fabricating a bipolar junction device with a reduced emitter area and a reduced emitter-base capacitance level.

It is a feature of the present invention to have s-field spacers of silicon nitride for reducing the window through which ion implantation is carrier out to fabricate the emitter region of the device.

It is a further feature of the present invention that the spacers have a substantially uniform thickness over their width.

It is an advantage of the present invention that conventional fabrication techniques to VLSI technology can be used to fabricate the device of the present disclosure.

DETAILED DESCRIPTION OF THE PREFERRED EMBODIMENT

Figure 1:
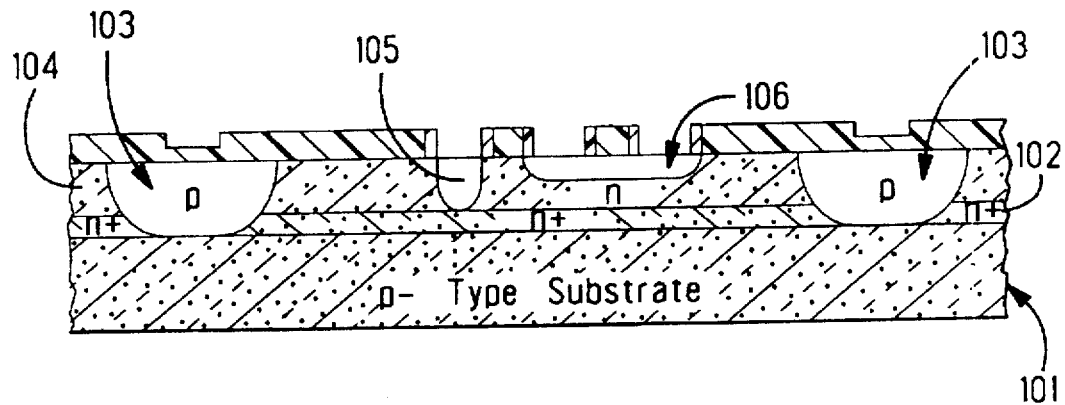
FIG. 1 is a cross-sectional view of the present invention prior to the formation of the emitter region.

The fabrication of the bipolar transistor of the present invention is done by generally conventional masking and diffusion steps well known to one of ordinary skill in the art. The use of the s-field spacer, and in particular the s-field spacer as described herein, to enable the fabrication of a bipolar junction transistor having a reduced capacitance and greater frequency response is the major import of the invention. Accordingly, the fabrication of the device can be subject to modification and variation within the purview of one of ordinary skill in the art having had the benefit of the instant disclosure. Turning to FIG. 1, a typical silicon or silicon germanium based bipolar junction transistor is shown. The thrust of the present disclosure is drawn to an npn structure, however clearly a pnp structure could be fabricated through variations of the disclosure of the present invention. In the first embodiment of the present invention, as is disclosed in FIG. 1, an isolated structure is fabricated. A p-type substrate is utilized to effect lateral isolation of the device from neighboring devices on the wafer. This substrate shown at 101 has a dopant concentration on the order of $5 \times 10^{15}$ to $5 \times 10^{16}$ atoms/cc. Thereafter, an $n^+$ epitaxial layer is grown by conventional technique as is shown at 102. This layer forms the buried layer of the device having relatively low sheet resistance. The impurity dopant used in the doping of this layer is generally arsenic or antimony as these impurities diffuse slowly and do not out-diffuse during subsequent processing steps. After the layer 102 is grown, a layer of n-type semiconductor is again epitaxially deposited. The $n^+$ layer 102 and n-type layer 104 have impurity concentrations of $5 \times 10^{18}$ to $8 \times 10^{19}$ and $4 \times 10^{15}$ to $3 \times 10^{16}$ respectively. Thereafter, the layers of p-type isolation shown at 103 are fabricated. These layers are placed to isolate the transistor structure from lateral current flow to and from neighboring devices by the implantation of p-type impurities. The p-type layers 103 are effected by a standard mask step and ion implantation of boron or other suitable p-type dopant is introduced. This can also be done by standard thermal deposition and diffusion steps. The p-type diffusion of the isolation layers 103 is done to isolate the collectors from one another with reverse biased pn junctions, assuming large scale fabrication. Because of the depth to which the diffusion must penetrate, the diffusion requires several hours in a diffusion furnace in temperatures on the order of approximately 1200° C. In a second embodiment, an embodiment in which this isolation is not required, for example in a common collector structure, the p-type substrate as well as the p-type isolation layers 101,103 respectively are not utilized. To this end, the n$^+$layer 102 is the first layer of the device with the n-type layer 104 disposed directly thereon.

After the fabrication of the p-type isolation regions 103, the fabrication of the collector contact is effected. To this end, a low resistance collector contact from the surface of the device down to the n$^+$layer 102 is carried out. This is typically done by the use of phosphorous in an implantation step using conventional masking and ion implantation techniques. The collector contact region is as shown at 105. Next, the base is fabricated by standard technique. To this end, boron diffusion through an ion implantation is carried out by using a conventional mask, effecting a base having a depth on the order of 0.2 ro 1.0 microns. While this step is generally for the fabrication of the base used in transistors, assuming large scale fabrication, it can also be used to effect many of the integrated resistors of the circuit. The base of the preferred embodiment of the present invention is done in a two step technique, with a breakdown enhancing guarding fabricated circumferentially about the base region using boron as well as the fabrication of the active base region in the center. Furthermore, BF$_2$ is selectively implanted into the base contacts, the extrinsic base region, and thereby reduces both the extrinsic base resistance and the base contact resistance.

Figure 2:
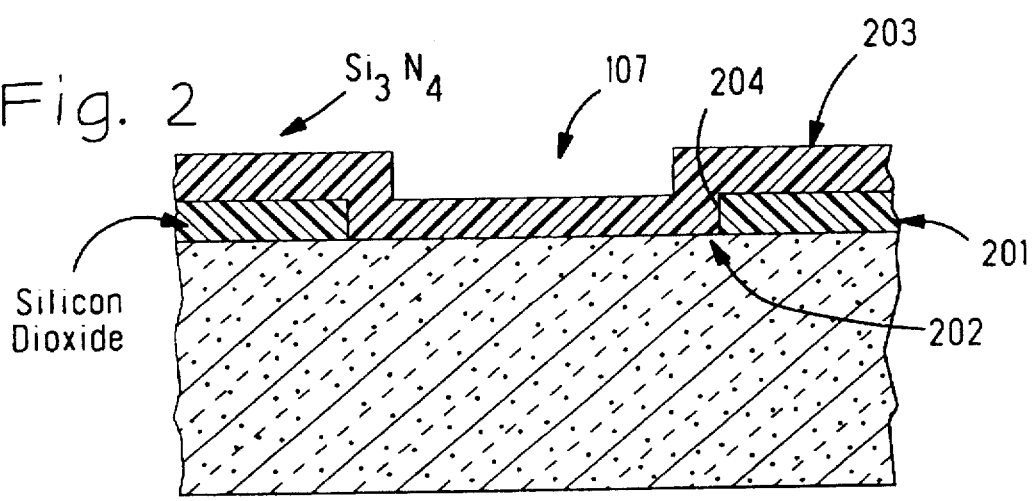
FIG. 2 is a cross-sectional view of the device of the present invention near the emitter, showing the silicon dioxide window with the silicon nitride disposed thereon.

With the collector and base fabricated, the present invention is utilized to reduce the width of the emitter region, and thereby reduce the parasitic capacitances associated with the emitter base junction. FIG. 2 shows a section of the wafer about the emitter region 107. To this end, the emitter region of the present invention is fabricated by the use of the s-field spacers. To this end, a window in the silicon dioxide layer 201 having a width on the order of approximately 0.5 microns is opened using standard photolithographic printing and etching processes well known to one of ordinary skill in the art. The window is shown at 202. This translates into 0.5 micron spacers between the individual resist line openings and an approximately 2.0 micron emitter to emitter spacing across the wafer. The photoresist employed is generally a standard photoresist and the resist exposure is accomplished utilizing contact printing as well as with a light source that has a guaranteed resolution from the manufacture on the order of 0.22 microns. An antireflective coating is deposited to eliminate standing waves within the exposed area of the resist film. Thereafter, the s-field process is employed to reduce the 0.5 linewidth to the desired linewidth of the emitter opening on the order of 0.25 microns or less. To this end, the silicon nitride film 203 is conformally deposited over the entire surface of the wafer containing the 0.5 etched featured. Low pressure chemical vapor deposition (LPCVD) enables uniform silicon nitride growth both vertically as is shown from the surface and horizontally from the feature sidewalls of the contact openings shown at 204. The use of LPCVD is a key step in fabricating the sidewall spacers of the present invention. The deposition at low pressure enables the deposition of a more dense, more uniform nitride film. The uniform, conformal growth of the nitride from all surfaces, and in particular the sidewalls, yields a thickness, density and uniformity desired to effect the spacers of the present invention. Higher pressure deposition, to include plasma enhanced techniques and techniques at or near atmospheric pressures, will not properly adhere to the initial feature sidewalls of SiO$_2$. Without this, the spacers, and ultimately the reduced emitter width and line spacings could not be realized.

Figure 4:
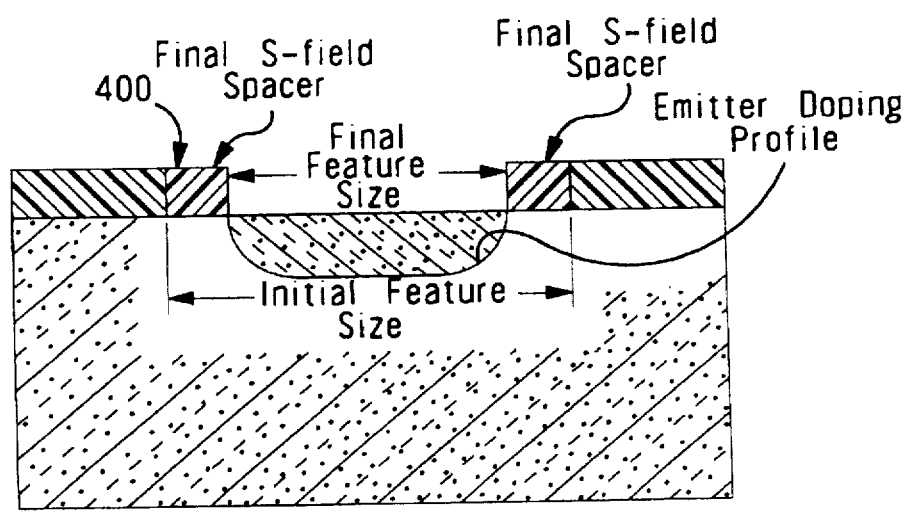
FIG. 4 shows the final result of the emitter region with the s-field spacers therein and the doping profile of the emitter after ion implantation.
Figure 5:
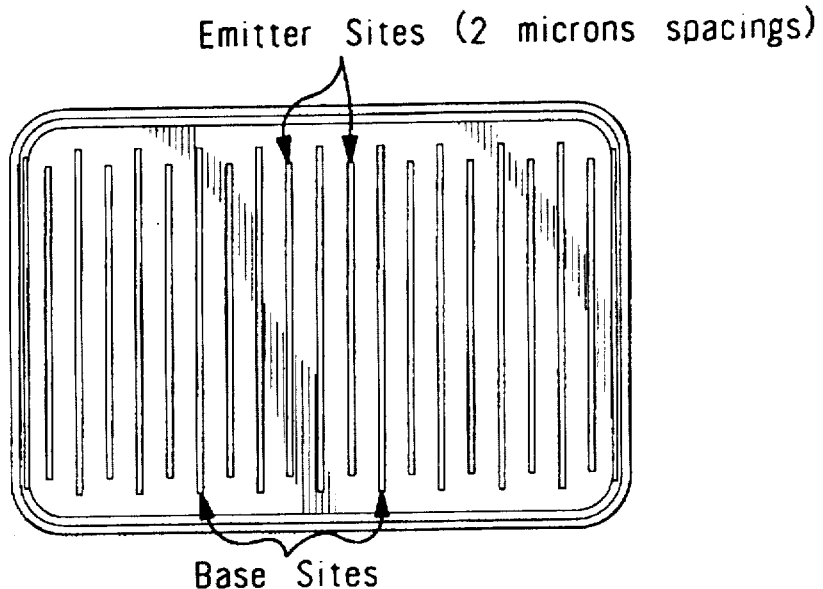
FIG. 5 is a top view of the emitter and base line contacts.
Figure 3:
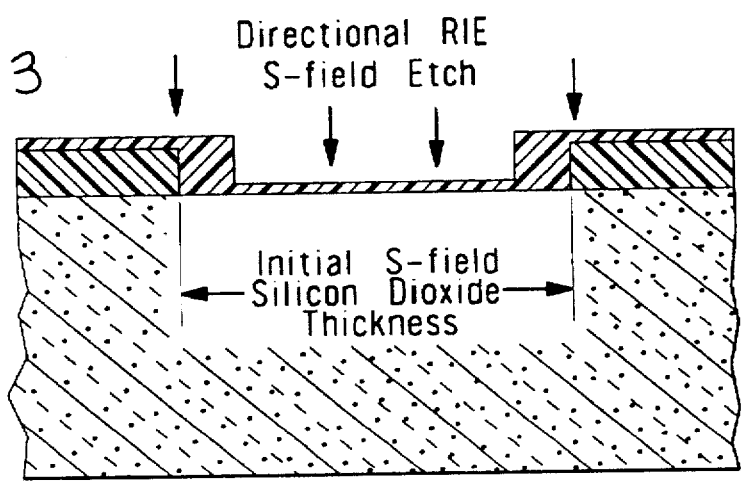
FIG. 3 is a cross-sectional view of the structure of FIG. 2 having been partially etched by reactive ion etching.

A standard reactive ion etching is done to remove the silicon nitride from the horizontal surfaces without etching the sidewalls of the etched patterns. The etching process is as shown in FIGS. 3 and the final result shown in FIG. 4. The result is a final spacer that has an emitter align width on the order of 0.25 microns or less. Because the same technique is applied to the openings used for the base and collector, the contact openings are accordingly reduced at the base and the collector. This is an intrinsic benefit of the large scale fabrication technique of the present invention. After the removal of the nitride layer with the final feature size as is shown in FIG. 4, the emitter having a reduced linewidth is formed. To this end, a suitable dopant such as arsenic which has a high solid solubility, high surface concentration and has a good lattice match with silicon is utilized to effect the emitter. This is done again using a standard ion implantation technique well known to one of ordinary skill in the art. There is a desired benefit to the present invention which results from the uniform LPCVD Si$_3$N$_4$ film as well as the RIE etching to remove the nitride from horizontal surfaces while not removing the nitride from the sidewalls or vertical surfaces. To this end, as is shown in FIG. 4, the s-field spacers shown at 400 have substantially right angle corners as is shown at 401. The result of such a structure, as opposed to one in which there is a significant rounding or tapering of the corners, is in the effectiveness of the spacers as a mask in the ion implantation technique used in the formation of the emitter region. By having the spacer with a thickness which is substantially uniform across its width, a more effective mask is realized. That is, in the implantation process, the s-field spacer impedes the penetration of ions except in the opening of the final feature size. In the event that the spacer does not have the required thickness as can result when the spacer is rounded or has a taper as is shown in the prior art, the ions in the ion implantation step can penetrate the silicon nitride spacer thereby coming to rest in the n-type layer of the device outside the opening of the window between the spacers. The resulting emitter diffusion profile is wider than is desired. The result being a wider emitter-base junction area overlap, with the attendant increase in the emitter-base junction capacitance. The present invention, on the other hand, has the desired thickness of mask material in the silicon nitride s field spacer across the width of the spacer, resulting in much better defined emitter regions, having a reduced width and thereby a reduced overlap with the active base region. Accordingly, reductions in parasitic capacitance are realized by the present invention, particularly through the use of the shape of the s field spacers as is shown in FIG. 4.

Figure 6:
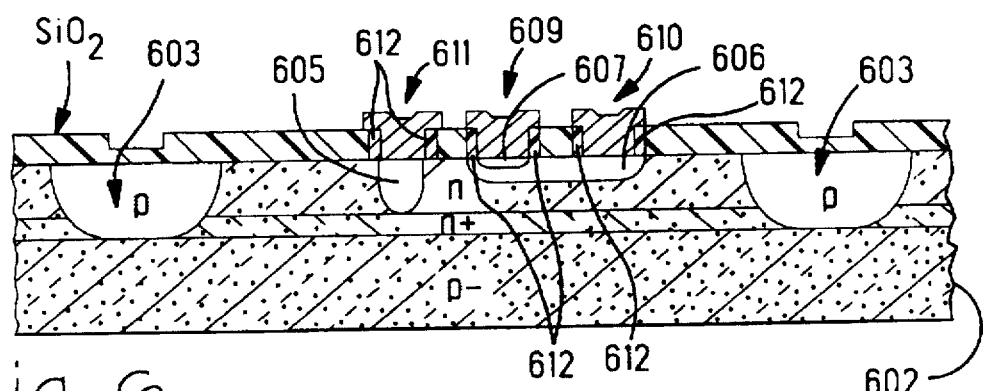
FIG. 6 is a cross-sectional view of the preferred embodiment of the present disclosure.

After the fabrication of the emitter region, contact metallization is effected by a sintered platinum silicide and a subsequent titanium, platinum and gold deposition defined into 0.5 micron fingers with 0.6 micron spaces via liftoff photolithography and e-beam evaporation. Plasma Enhanced Chemical Vapor Deposition (PECVD) is used to deposit silicon nitride and effects the final encapsulation to ensure long term stability of the device DC and RF parameters. The final structure, shown in FIG. 6 has a p-type substrate 601, with an n$^+$layer 602, p-type isolation regions 603, the emitter region 607, the base region 606 and the collector region 605. The metallization is shown for the emitter, base and collector as 609,610, and 611, respectively. Finally, the $Si_3N_4$ spacers are shown at 612.

In a further embodiment, the device in which the common collector configuration is realized, the top surface of the device having the emitter and base openings effected by the s field technique is done as is described above. To this end, an n+layer would constitute the lower surface of the device, thereby a p-type substrate is not utilized. Thereafter, the n-type epilayer is grown as is described above and disposed on top with a contact for the collector on the lower surface in contact with the n+layer otherwise, the fabrication steps are virtually identical to that described in connection with the isolated device.

The preferred doping levels are $1\times10^{16}$ for the collector, $1\times10^{18}$ for the base and $5\times10^{20}$ for the emitter. Ion implantation is the preferred doping technique for the fabrication of the collector, the base and the emitter, although diffusion by other techniques is possible as is readily apparent to one of ordinary skill in the art. Finally, the collector epitaxial thickness is on the order of 1 micron, the base depth 0.3 to 0.35 microns and the emitter depth is on the order of 0.2 to 0.25 microns.

The present invention results in a device in which the emitter width is reduced to effectively reduce the area of overlap of the emitter and active base. While the extrinsic base region can be reduced as well to reduce the transit time of carriers, it is the reduction in the emitter/base active area which results in the reduction in parasitic capacitance in a silicon bipolar junction transistor. The present invention has resulted in the fabrication of contact printing into sub-half micron range emitter spacings with the resultant feature size of less than 0.25 microns. The fundamental oscillation of the silicon BJT of the present invention is as high as 12.0 GHz. The present invention envisions the use of a BJT that can be utilized in the fabrication of voltage controlled oscillators as well as other applications in the microwave and rf fields.

The present invention having been described in detail, it is envisioned that other applications of the teaching of the present invention as well as modifications thereof are well within the purview of the artisan of ordinary skill. To this end, a new process for fabricating 0.25 microns or less emitter spacings on silicon BJTs by the use of s field spacers and silicon nitride having a substantially uniform thickness across the width of the spacer is a basic teaching of the present invention. The resultant emitter area having a well defined diffusion profile and the resultant reduction in area of overlap between the emitter and active base regions results in a reduction of parasitic capacitance with the resultant higher frequency capabilities of the resultant device. To the extent that such modification is achieved by one of ordinary skill in the art having had the benefit of the instant disclosure, such modification is deemed within the purview of the invention.

I claim:

1. A method of fabricating a bipolar junction transistor, comprising the steps of:

growing an n+ doped layer on top of a p-type substrate; growing an n-doped layer on said n+ layer; growing a layer of silicon dioxide on said n-doped layer; opening windows at locations of said layer of silicon dioxide, said locations being for an emitter, a base and a collector; depositing a layer of silicon nitride by LPCVD on top of said layer silicon dioxide and in said windows; reactive ion etching said silicon nitride layer to form spacers in said windows; and implanting selected dopant ions through said windows to form an emitter region, a base region and a collector region.

2. A method of fabricating a bipolar junction transistor as recited in claim 1 wherein said spacers have a width and thickness, said thickness being substantially uniform across said width.

3. A method of fabricating a bipolar junction transistor as recited in claim 2 wherein said spacers in said windows are separated by 0.25 microns or less.

4. A method of fabricating a bipolar junction transistor as recited in claim 3 wherein said emitter region has a width substantially equal to said width between said spacers and said windows.

5. A method of fabricating a bipolar junction transistor as recited in claim 1 wherein said p-type substrate, said n+ doped layer and said n doped layer are silicon.

6. A method of fabricating a bipolar junction transistor as recited in claim 1 wherein p-doped isolation regions are fabricated through selectively disposed openings in said layer of silicon dioxide.

7. A method of fabricating a bipolar junction transistor, comprising the steps of:

growing an n-doped layer on an n+ doped substrate; growing a layer of silicon dioxide on said n-doped layer; opening windows at locations of said layer of silicon dioxide said locations being for an emitter, a base and a collector; depositing a layer of silicon nitride by LPCVD on top of said layer of silicon dioxide and in said windows; reaction ion etching said silicon nitride layer to form spacers in said windows; and implanting selected dopant ions through said windows to form an emitter region, a base region and a collector region.

8. A method of fabricating a bipolar junction transistor as recited in claim 7 wherein said spacers have a width and thickness, said thickness being substantially uniform across said width.

9. A method of fabricating a bipolar junction transistor as recited in claim 8 wherein said spacers in said windows are separated by 0.25 microns or less.

10. A method of fabricating a bipolar junction transistor as recited in claim 9 wherein said emitter region has a width substantially equal to said width between said spacers and said windows.

11. A method of fabricating a bipolar junction transistor as recited in claim 7 wherein said p-type substrate, said n+ doped layer and said n doped layer are silicon.

12. A method of fabricating a bipolar junction transistor as recited in claim 7 wherein p-doped isolation regions are fabricated through selectively disposed openings in said layer of silicon dioxide.

* * * * *